(12) United States Patent
Sato et al.

(10) Patent No.: US 11,705,881 B2
(45) Date of Patent: Jul. 18, 2023

(54) BRANCHING FILTER

(71) Applicant: TDK CORPORATION, Tokyo (JP)

(72) Inventors: Takuya Sato, Tokyo (JP); Kazuhiro Tsukamoto, Tokyo (JP); Masanori Tsutsumi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/686,186

(22) Filed: Mar. 3, 2022

(65) Prior Publication Data
US 2022/0294411 A1 Sep. 15, 2022

(30) Foreign Application Priority Data
Mar. 9, 2021 (JP) .................... 2021-037868

(51) Int. Cl.
*H03H 7/01* (2006.01)
*H03H 7/46* (2006.01)

(52) U.S. Cl.
CPC ........ *H03H 7/0161* (2013.01); *H03H 7/0115* (2013.01); *H03H 7/46* (2013.01)

(58) Field of Classification Search
CPC ........ H03H 2001/0085; H03H 7/0115; H03H 7/0161; H03H 7/46
USPC ................................. 333/175, 185
See application file for complete search history.

(56) References Cited

U.S. PATENT DOCUMENTS

| 9,413,328 B2 * | 8/2016 | Tsukamoto | ............ H03H 7/461 |
| 2018/0006625 A1 | 1/2018 | Kaminishi | |
| 2021/0104996 A1 * | 4/2021 | Mori | .................... H03H 7/1783 |

* cited by examiner

*Primary Examiner* — Rakesh B Patel
(74) *Attorney, Agent, or Firm* — Oliff PLC

(57) ABSTRACT

A branching filter includes a common port, a first signal port, a second signal port, a first filter, which is provided between the common port and the first signal port, that selectively passes a signal of a frequency within a first passband, a second filter, which is provided between the common port and the second signal port, that selectively passes a signal of a frequency within a second passband different from the first passband, and a capacitor that has a first end and a second end and connects the first filter and the second filter.

9 Claims, 17 Drawing Sheets

BRANCHING FILTER

BACKGROUND OF THE INVENTION

1. Field of the Invention

The present invention relates to a branching filter for separating a plurality of signals of mutually different frequencies from each other.

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. Examples of the first and second filters include an LC resonator formed using inductors and capacitors.

Among known branching filters are ones that use a stack including dielectric layers, as disclosed in US 2018/0006625 A1.

More and more compact mobile communication apparatuses have been made to be multisystem (multiband) to use signals of a plurality of frequencies in recent years. Using the signals of a plurality of frequencies requires the branching filter to meet more severe characteristic requirements. For example, the increase of the pass attenuation of the second filter in a frequency band higher than the second frequency band is required. However, there has conventionally been a problem that increasing the pass attenuation of the second filter in the higher frequency band deteriorates the insertion loss of the first filter.

SUMMARY OF THE INVENTION

An object of the present invention is to provide a branching filter including a first filter and a second filter, where the pass attenuation of the second filter in a high frequency band can be increased while preventing a deterioration in the insertion loss of the first filter.

A branching filter according to the present invention includes a common port, a first signal port, a second signal port, a first filter, which is provided between the common port and the first signal port, that selectively passes a signal of a frequency within a first passband, a second filter, which is provided between the common port and the second signal port, that selectively passes a signal of a frequency within a second passband different from the first passband, and a capacitor, which has a first end and a second end, that connects the first filter and the second filter.

In the branching filter according to the present invention, the second passband may be a frequency band higher than the first passband. In such a case, the branching filter according to the present invention may further include a first path that connects the common port and the first signal port. The first filter may include a first inductor provided in the first path. The first end of the capacitor may be connected to the first path between the first inductor and the first signal port.

If the second passband is a frequency band higher than the first passband, the branching filter according to the present invention may further include a second path that connects the common port and the second signal port. The second filter may include a second inductor provided between the second path and a ground. The second end of the capacitor may be connected to a third path that connects the second path and the second inductor.

In the branching filter according to the present invention, if the second passband is a frequency band higher than the first passband, the capacitor may form an attenuation pole on a high frequency side of the second passband in a pass characteristic of the second filter.

In the branching filter according to the present invention, the first filter and the second filter may constitute a diplexer.

The branching filter according to the present invention may further include a third signal port, and a third filter, which is provided between the common port and the third signal port, that selectively passes a signal of a frequency within a third passband different from the first and second passbands. In such a case, the third passband may be a frequency band higher than the first and second passbands. The first filter, the second filter, and the third filter may constitute a triplexer.

The branching filter according to the present invention includes the first filter, the second filter, and the capacitor that connects the first filter and the second filter. According to the present invention, the pass attenuation of the second filter in a high frequency band can thus be increased while preventing a deterioration in the insertion loss of the first filter.

Other and further objects, features and advantages of the present invention will appear more fully from the following description.

DETAILED DESCRIPTION OF THE PREFERRED EMBODIMENTS

First Embodiment

Figure 1:
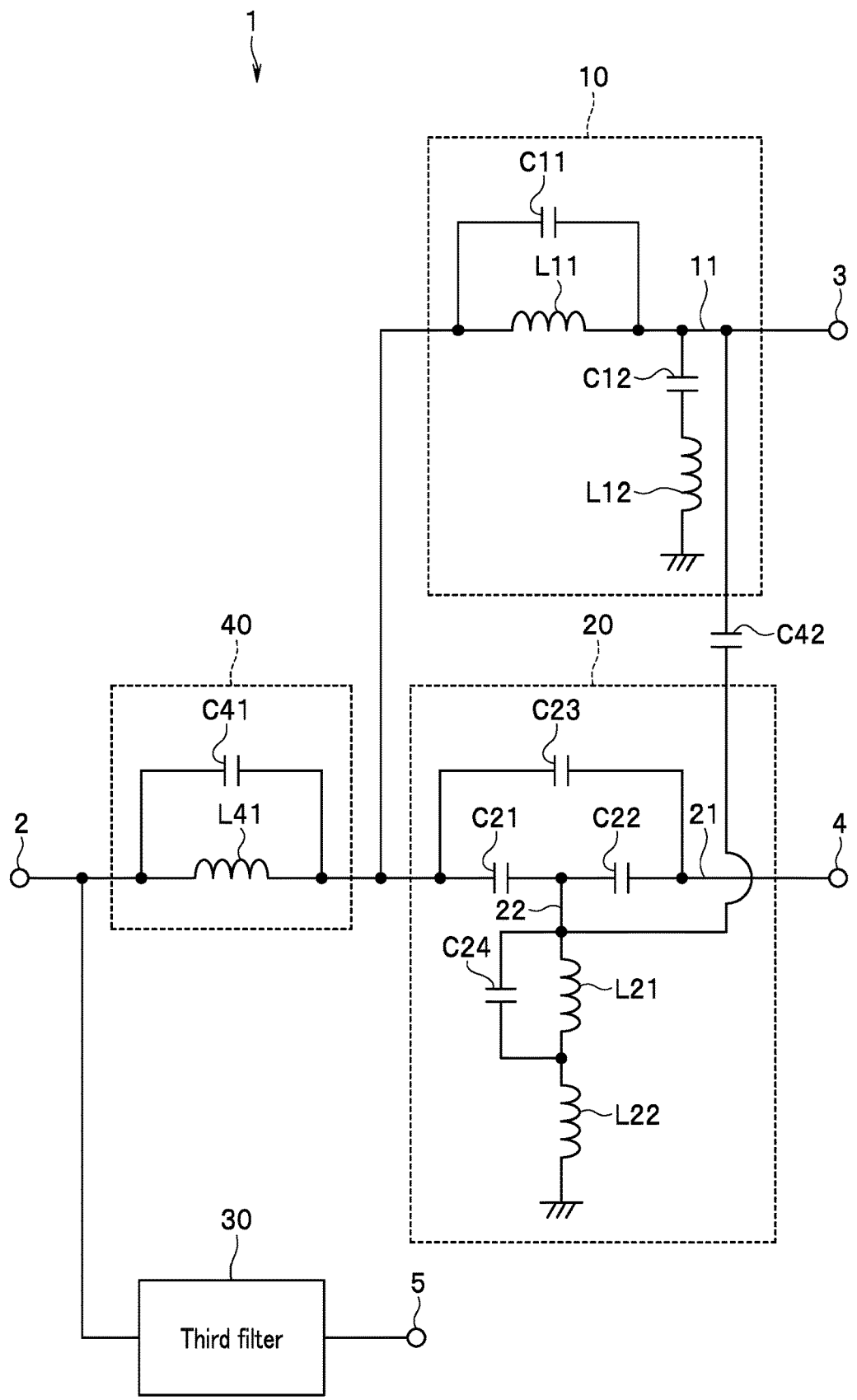
FIG. 1 is a circuit diagram showing circuit configuration of a branching filter according to a first embodiment of the invention.

Preferred embodiments of the present invention will now be described in detail with reference to the drawings. First, the configuration of a branching filter 1 according to the first embodiment of the invention will be outlined with reference to FIG. 1. FIG. 1 is a circuit diagram showing circuit configuration of the branching filter 1. The branching filter 1 includes a common port 2, a first signal port 3, a second signal port 4, a third signal port 5, a first filter 10, a second filter 20, and a third filter 30. The branching filter 1 is a triplexer including the first to third filters 10, 20, and 30.

In the circuit configuration, the first filter 10 is provided between the common port 2 and the first signal port 3, the second filter 20 is provided between the common port 2 and the second signal port 4, and the third filter 30 is provided between the common port 2 and the third signal port 5. In the present application, the expression of "in the (a) circuit configuration" is used to indicate not layout in physical configuration but layout in the circuit diagram.

The first filter 10 selectively passes a signal of a frequency within a first passband. The second filter 20 selectively passes a signal of a frequency within a second passband different from the first passband. The third filter 30 selectively passes a signal of a frequency within a third passband different from the first and second passbands. In particular, in the present embodiment, the second passband is a frequency band higher than the first passband. The third passband is a frequency band higher than the first and second passbands.

The branching filter 1 further includes an LC circuit 40 and a capacitor C42. The LC circuit 40 is provided between the common port 2 and the first and second filters 10 and 20 in the circuit configuration. The capacitor C42 has a first end and a second end, and connects the first filter 10 and the second filter 20. As will be described in detail below, the capacitor C42 forms an attenuation pole on the high frequency side of the second passband in the pass characteristic of the second filter 20.

The branching filter 1 further includes a first path 11 that connects the common port 2 and the first signal port 3, and a second path 21 that connects the common port 2 and the second signal port 4. The first path 11 is a path leading from the common port 2 to the first signal port 3 via the LC circuit 40 and the first filter 10. The second path 21 is a path leading from the common port 2 to the second signal port 4 via the LC circuit 40 and the second filter 20. The first path 11 and the second path 21 branch between the LC circuit 40 and the first and second filters 10 and 20.

The first filter 10 includes a first inductor provided in the first path 11. The first end of the capacitor C42 is connected to the first path 11 between the first inductor and the first signal port 3.

The second filter 20 includes a second inductor provided between the second path 21 and a ground. The second end of the capacitor C42 is connected to a third path 22 that connects the second path 21 and the second inductor.

Figure 2:
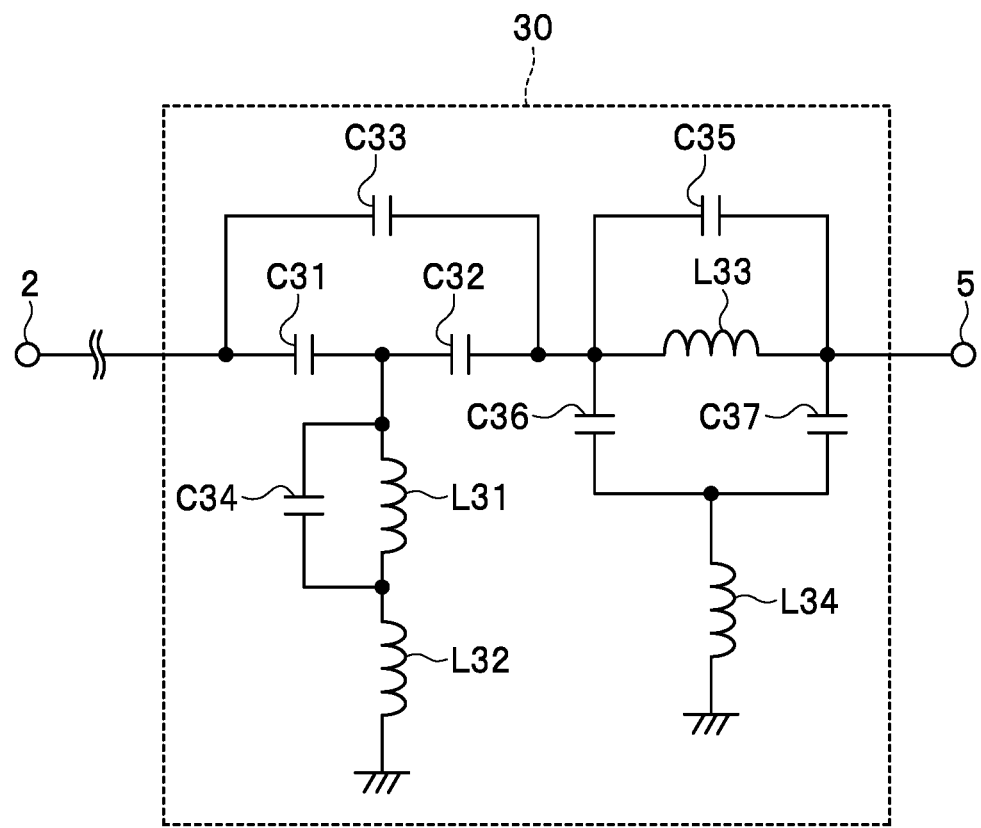
FIG. 2 is a circuit diagram showing circuit configuration of a third filter shown in FIG. 1.

Next, an example of the configuration of the first filter 10, the second filter 20, the third filter 30, and the LC circuit 40 will be described with reference to FIG. 1 and FIG. 2. FIG. 2 is a circuit diagram showing a circuit configuration of the third filter 30.

The LC circuit 40 includes an inductor L41 and a capacitor C41. One end of the inductor L41 is connected to the common port 2. The capacitor C41 is connected in parallel with the inductor L41.

The first filter 10 includes inductors L11 and L12, and capacitors C11 and C12. One end of the inductor L11 is connected to the other end of the inductor L41 of the LC circuit 40. The other end of the inductor L11 is connected to the first signal port 3. The capacitor C11 is connected in parallel with the inductor L11. One end of the capacitor C12 is connected to the other end of the inductor L11. One end of the inductor L12 is connected to the other end of the capacitor C12. The other end of the inductor L12 is connected to the ground.

The inductor L11 is provided in the first path 11. The inductor L11 corresponding to the first inductor.

The second filter 20 includes inductors L21 and L22, and capacitors C21, C22, C23, and C24. One end of the capacitor C21 is connected to the other end of the inductor L41 of the LC circuit 40. One end of the capacitor C22 is connected to the other end of the capacitor C21. The other end of the capacitor C22 is connected to the second signal port 4. One end of the capacitor C23 is connected to the one end of the capacitor C21. The other end of the capacitor C23 is connected to the one end of the capacitor C22.

One end of the inductor L21 is connected to a connection point between the capacitor C21 and the capacitor C22. One end of the inductor L22 is connected to the other end of the inductor L21. The other end of the inductor L22 is connected to the ground. The capacitor C24 is connected in parallel with the inductor L21.

The inductor L21 is provided between the second path 21 and the ground. The third path 22 connects the second path 21 and the inductor L21. The inductor L21 corresponds to the second inductor.

The first end of the capacitor C42 is connected to the first path 11 between the inductor L11 and the first signal port 3. The second end of the capacitor C42 is connected to the third path 22.

The third filter 30 includes inductors L31, L32, L33, and L34, and capacitors C31, C32, C33, C34, C35, C36, and C37. One end of the capacitor C31 is connected to the common port 2. One end of the capacitor C32 is connected to the other end of the capacitor C31. One end of the capacitor C33 is connected to the one end of the capacitor C31. The other end of the capacitor C33 is connected to the other end of the capacitor C32.

One end of the inductor L31 is connected to a connection point between the capacitor C31 and the capacitor C32. One end of the inductor L32 is connected to the other end of the inductor L31. The other end of the inductor L32 is connected to the ground. The capacitor C34 is connected in parallel with the inductor L31.

One end of the inductor L33 is connected to the other end of the capacitor C32. The other end of the inductor L33 is connected to the third signal port 5. The capacitor C35 is connected in parallel with the inductor L33. One end of the capacitor C36 is connected to the one end of the inductor L33. One end of the capacitor C37 is connected to the other end of the inductor L33. One end of the inductor L34 is connected to the other ends of the capacitors C36 and C37. The other end of the inductor L35 is connected to the ground.

Figure 3:
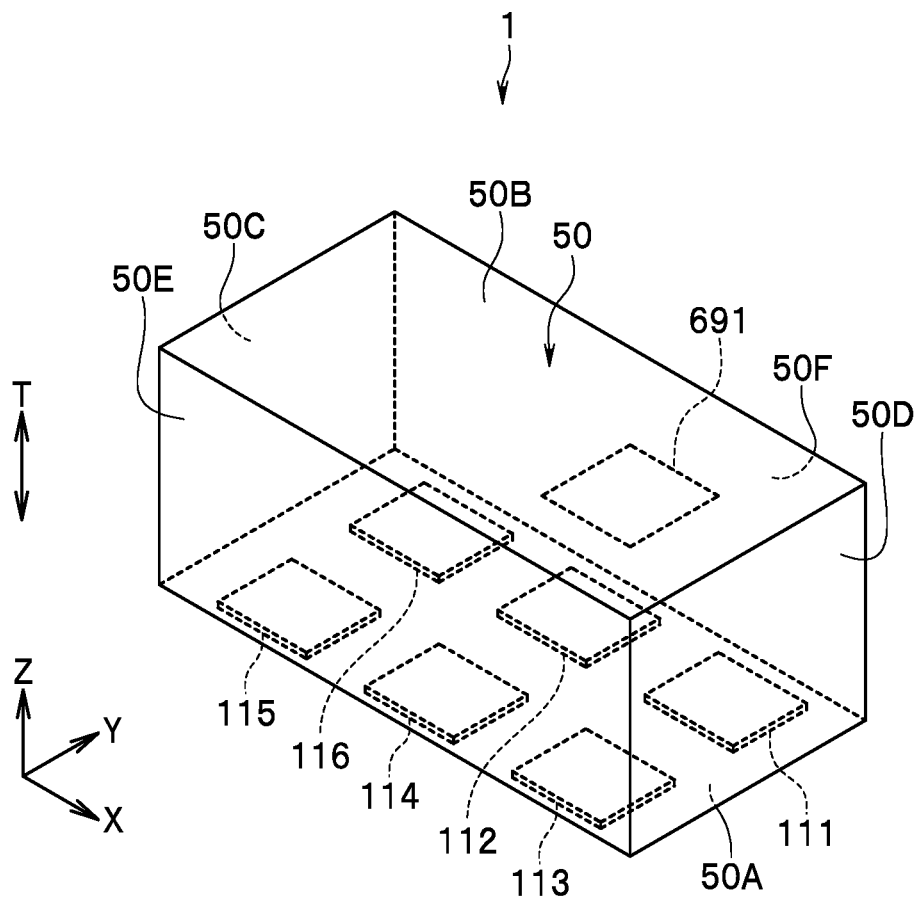
FIG. 3 is a perspective view showing an outside view of the branching filter according to the first embodiment of the invention.

Next, other configurations of the branching filter 1 will be described with reference to FIG. 3. FIG. 3 is a perspective view showing an outside view of the branching filter 1.

The branching filter 1 further includes a stack 50 including dielectric layers and conductor layers. The stack 50 is intended to integrate the common port 2, the first signal port 3, the second signal port 4, the third signal port 5, the first filter 10, the second filter 20, the third filter 30, the LC circuit 40, and the capacitor C42. The plurality of inductors and the plurality of capacitors included in the first filter 10, the second filter 20, the third filter 30, and the LC circuit 40, and the capacitor C42 are formed using the conductor layers.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 3. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively.

As shown in FIG. 3, the bottom surface 50A is located at the end of the stack 50 in the −Z direction. The top surface 50B is located at the end of the stack 50 in the Z direction. The bottom surface 50A and the top surface 50B each have a rectangular shape long in the X direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The branching filter 1 further includes a plurality of terminals 111, 112, 113, 114, 115, and 116 located at the bottom surface 50A of the stack 50. The terminals 111, 112, and 116 are arranged in this order in the −X direction at positions closer to the side surface 50F than to the side surface 50E. The terminals 113, 114, and 115 are arranged in this order in the −X direction at positions closer to the side surface 50E than to the side surface 50F.

The terminal 112 corresponds to the common port 2, the terminal 113 the first signal port 3, the terminal 114 the second signal port 4, and the terminal 115 the third signal port 5. The common port 2 and the first to third signal ports 3 to 5 are thus located at the bottom surface 50A of the stack 50. Each of the terminals 111 and 116 is connected to the ground.

Next, an example of the plurality of dielectric layers and the plurality of conductor layers constituting the stack 50 will be described with reference to FIG. 4A to FIG. 10. In this example, the stack 50 includes nineteen dielectric layers stacked together. The nineteen dielectric layers will be referred to as a first to a nineteenth dielectric layer in the order from bottom to top. The first to nineteenth dielectric layers are denoted by reference numerals 51 to 69, respectively.

Figure 4A:
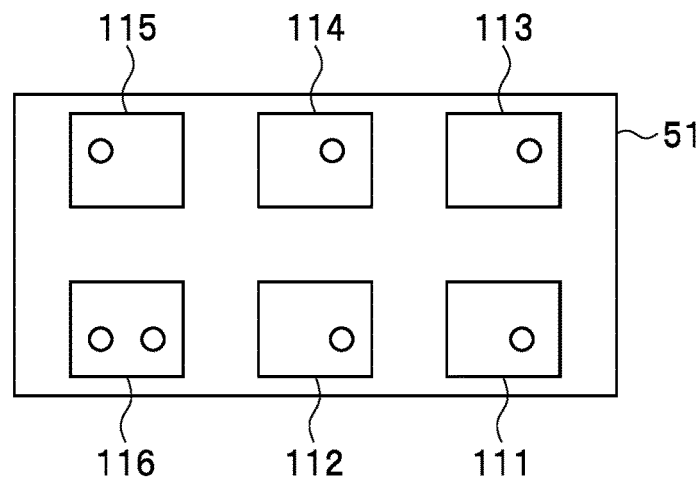
FIG. 4A to FIG. 4C are explanatory diagrams showing respective patterned surfaces of first to third dielectric layers of the stack of the branching filter according to the first embodiment of the invention.
Figure 4B:
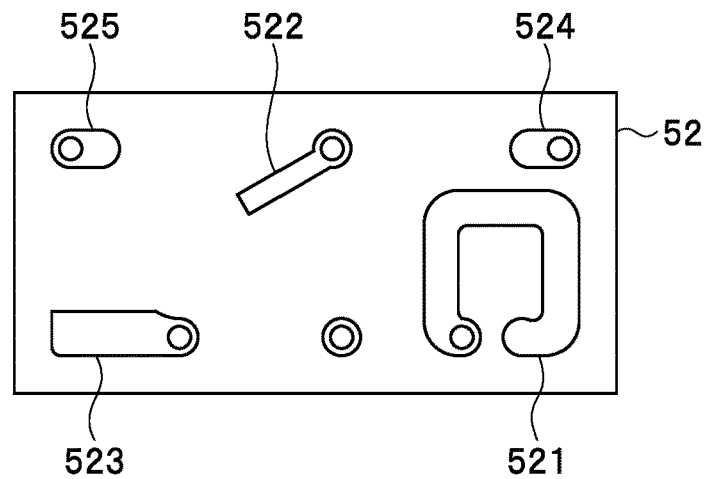
Figure 4C:
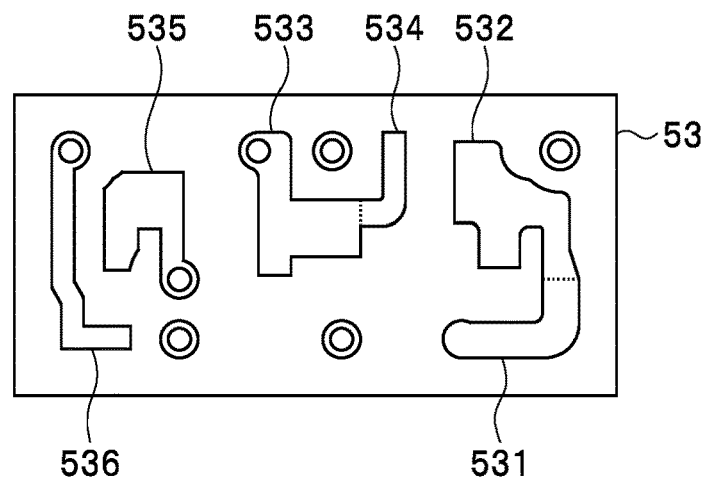

In FIG. 4A to FIG. 4C, each circle represents a through hole. Each of the dielectric layers 51 to 67 has a plurality of through holes. Each of the through holes is connected to a conductor layer or another through hole.

FIG. 4A shows the patterned surface of the first dielectric layer 51. The terminals 111 to 116 are formed on the patterned surface of the dielectric layer 51. FIG. 4B shows the patterned surface of the second dielectric layer 52. Conductor layers 521, 522, 523, 524, and 525 are formed on the patterned surface of the dielectric layer 52.

FIG. 4C shows the patterned surface of the third dielectric layer 53. Conductor layers 531, 532, 533, 534, 535, and 536 are formed on the patterned surface of the dielectric layer 53. The conductor layer 532 is connected to the conductor layer 531. The conductor layer 534 is connected to the conductor layer 533. In FIG. 4C, the border between the conductor layer 531 and the conductor layer 532 and the border between the conductor layer 533 and the conductor layer 534 are indicated by respective dotted lines.

Figure 5A:
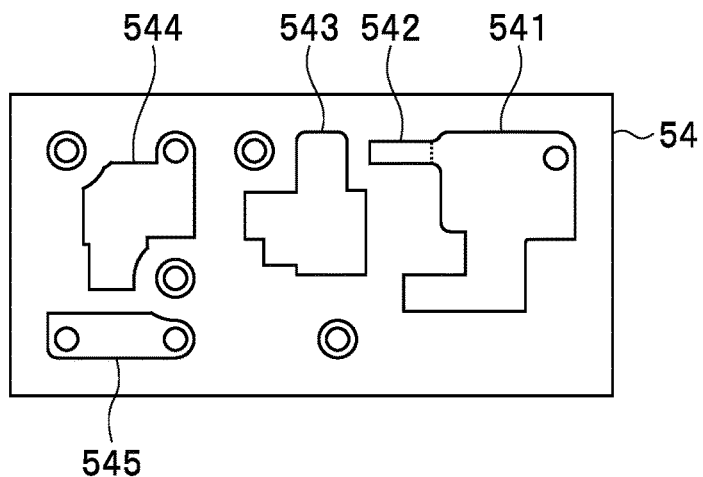
FIG. 5A to FIG. 5C are explanatory diagrams showing respective patterned surfaces of fourth to sixth dielectric layers of the stack of the branching filter according to the first embodiment of the invention.

FIG. 5A shows the patterned surface of the fourth dielectric layer 54. Conductor layers 541, 542, 543, 544, and 545 are formed on the patterned surface of the dielectric layer 54. The conductor layer 542 is connected to the conductor layer 541. In FIG. 5A, the border between the conductor layer 541 and the conductor layer 542 is indicated by a dotted line.

Figure 5B:
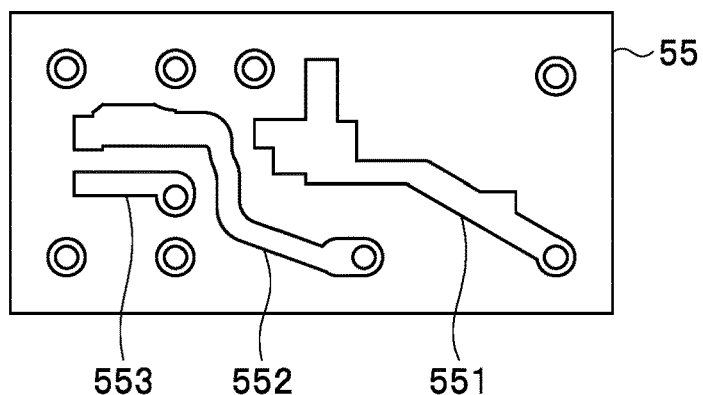
Figure 5C:
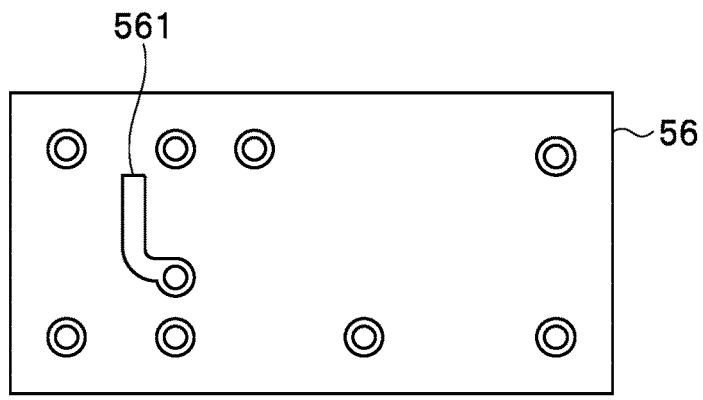

FIG. 5B shows the patterned surface of the fifth dielectric layer 55. Conductor layers 551, 552, and 553 are formed on the patterned surface of the dielectric layer 55. FIG. 5C shows the patterned surface of the sixth dielectric layer 56. A conductor layer 561 is formed on the patterned surface of the dielectric layer 56.

Figure 6A:
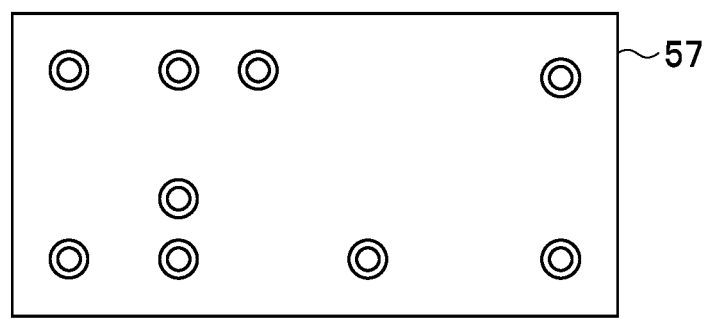
FIG. 6A to FIG. 6C are explanatory diagrams showing respective patterned surfaces of seventh to ninth dielectric layers of the stack of the branching filter according to the first embodiment of the invention.
Figure 6B:
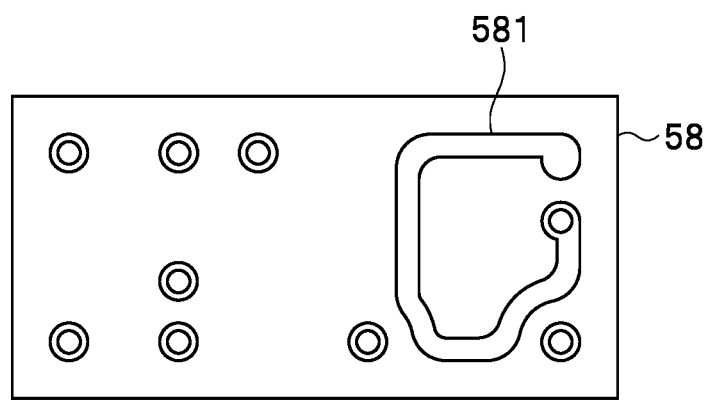
Figure 6C:
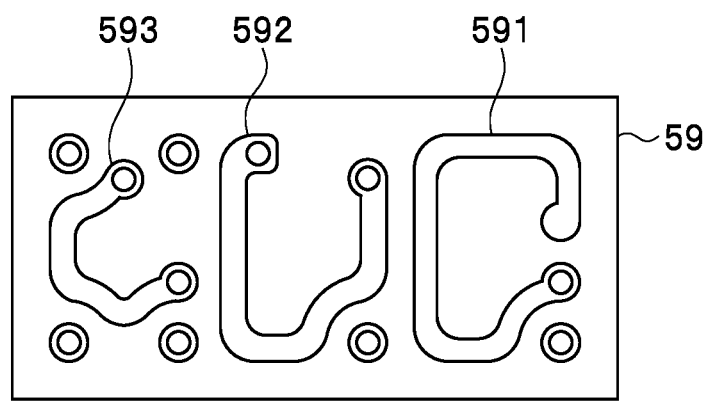

FIG. 6A shows the patterned surface of the seventh dielectric layer 57. No conductor layer constituting an inductor or capacitor is formed on the patterned surface of the dielectric layer 57. FIG. 6B shows the patterned surface of the eighth dielectric layer 58. A conductor layer 581 is formed on the patterned surface of the dielectric layer 58. FIG. 6C shows the patterned surface of the ninth dielectric layer 59. Conductor layers 591, 592, and 593 are formed on the patterned surface of the dielectric layer 59.

Figure 7A:
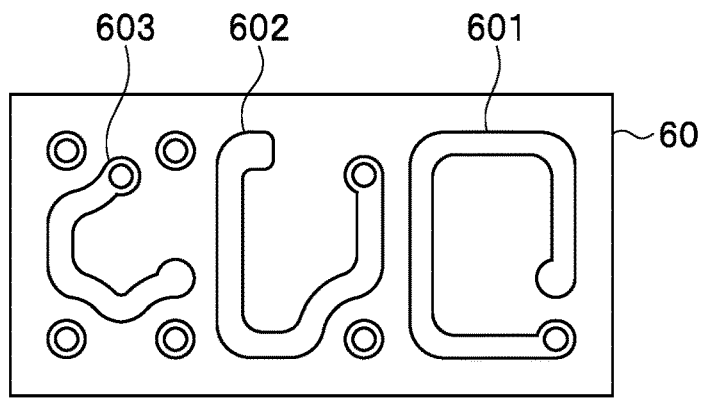
FIG. 7A to FIG. 7C are explanatory diagrams showing respective patterned surfaces of tenth to twelfth dielectric layers of the stack of the branching filter according to the first embodiment of the invention.
Figure 7B:
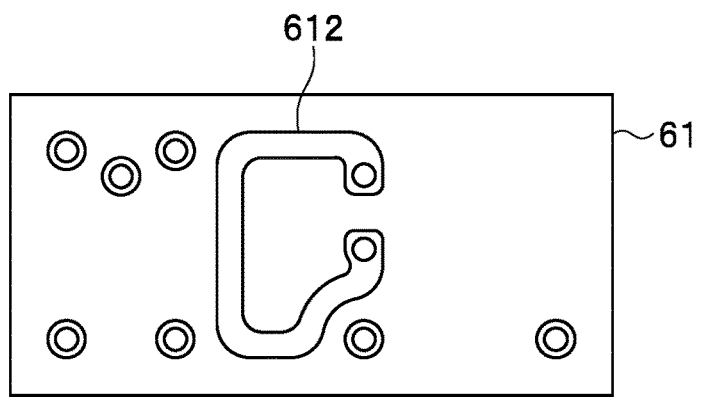
Figure 7C:
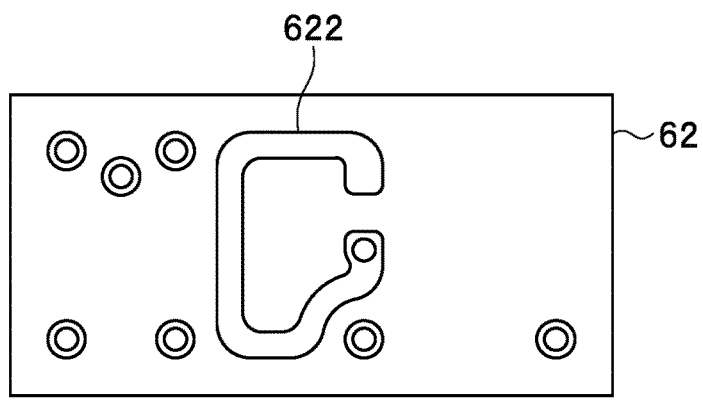

FIG. 7A shows the patterned surface of the tenth dielectric layer 60. Conductor layers 601, 602, and 603 are formed on the patterned surface of the dielectric layer 60. FIG. 7B shows the patterned surface of the eleventh dielectric layer 61. A conductor layer 612 is formed on the patterned surface of the dielectric layer 61. FIG. 6C shows the patterned surface of the twelfth dielectric layer 62. A conductor layer 622 is formed on the patterned surface of the dielectric layer 62.

Figure 8A:
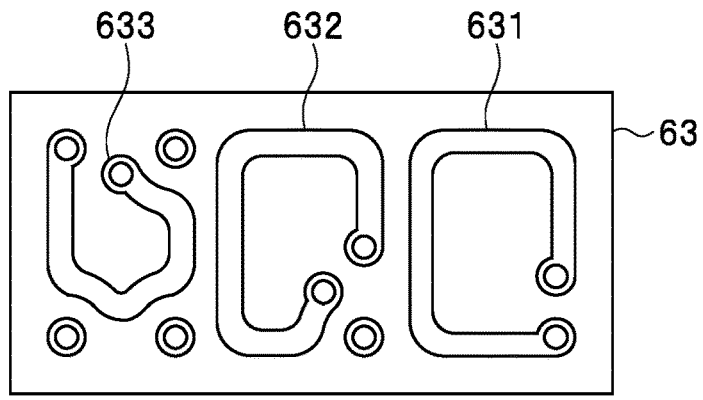
FIG. 8A to FIG. 8C are explanatory diagrams showing respective patterned surfaces of thirteenth to fifteenth dielectric layers of the stack of the branching filter according to the first embodiment of the invention.
Figure 8B:
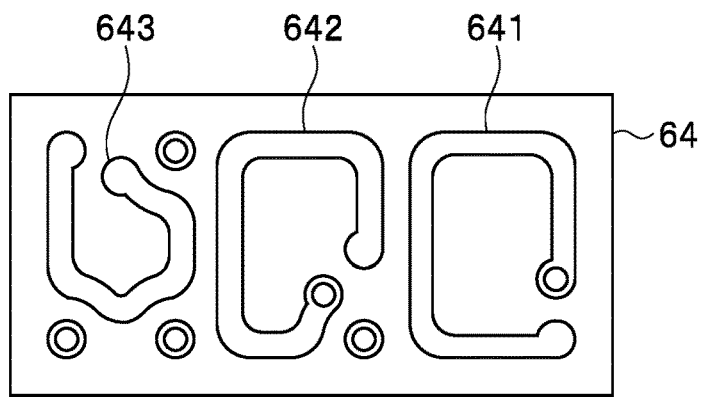
Figure 8C:
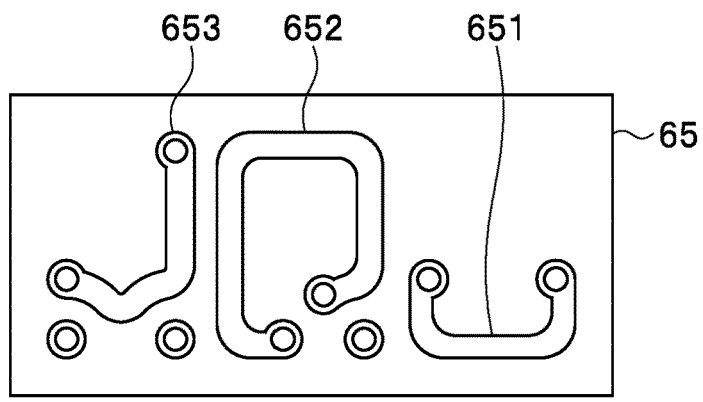

FIG. 8A shows the patterned surface of the thirteenth dielectric layer 63. Conductor layers 631, 632, and 633 are formed on the patterned surface of the dielectric layer 63. FIG. 8B shows the patterned surface of the fourteenth dielectric layer 64. Conductor layers 641, 642, and 643 are formed on the patterned surface of the dielectric layer 64. FIG. 8C shows the patterned surface of the fifteenth dielectric layer 65. Conductor layers 651, 652, and 653 are formed on the patterned surface of the dielectric layer 65.

Figure 9A:
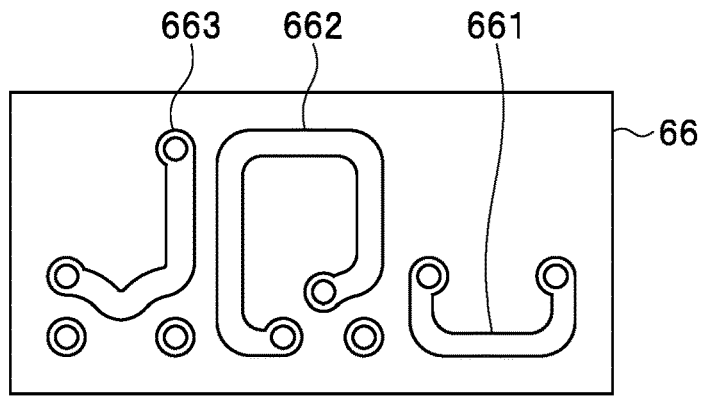
FIG. 9A to FIG. 9C are explanatory diagrams showing respective patterned surfaces of sixteenth to eighteenth dielectric layers of the stack of the branching filter according to the first embodiment of the invention.
Figure 9B:
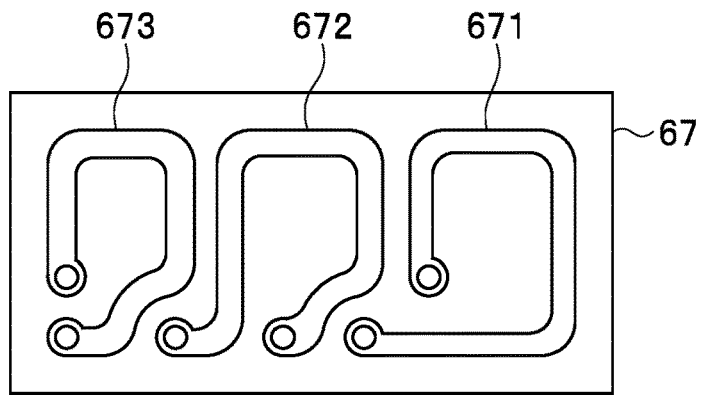
Figure 9C:
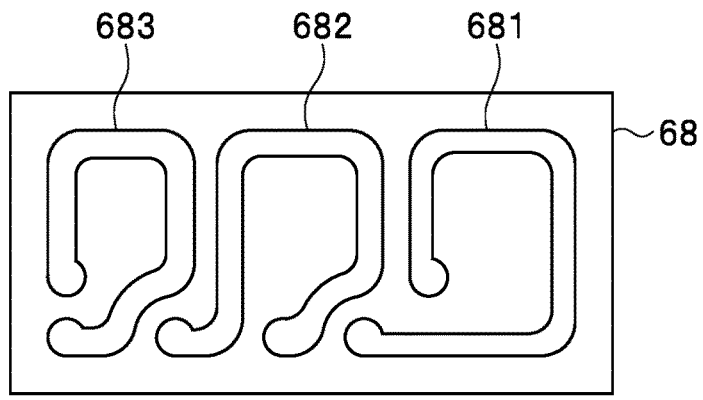

FIG. 9A shows the patterned surface of the sixteenth dielectric layer 66. Conductor layers 661, 662, and 663 are formed on the patterned surface of the dielectric layer 66. FIG. 9B shows the patterned surface of the seventeenth dielectric layer 67. Conductor layers 671, 672, and 673 are formed on the patterned surface of the dielectric layer 67. FIG. 9C shows the patterned surface of the eighteenth dielectric layer 68. Conductor layers 681, 682, and 683 are formed on the patterned surface of the dielectric layer 68.

Figure 10:
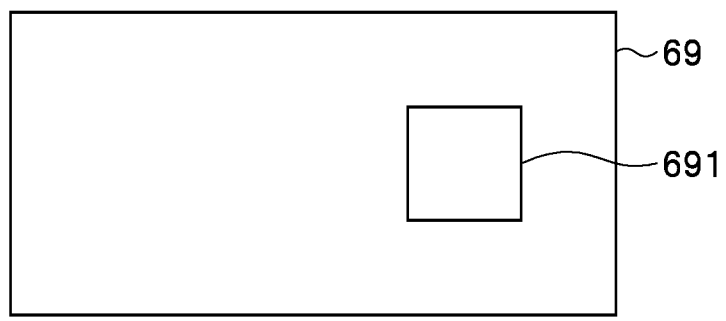
FIG. 10 is an explanatory diagram showing a patterned surface of nineteenth dielectric layer of the stack of the branching filter according to the first embodiment of the invention.

FIG. 10 shows the patterned surface of the nineteenth dielectric layer 69. A mark 691 made of a conductor layer is formed on the patterned surface of the dielectric layer 69.

The stack 50 shown in FIG. 3 is formed by stacking the first to nineteenth dielectric layers 51 to 69 such that the patterned surface of the first dielectric layer 51 serves as the bottom surface 50A of the stack 50 and the surface of the nineteenth dielectric layer 69 opposite to the patterned surface thereof serves as the top surface 50B of the stack 50.

Each of the through holes shown in FIG. 4A to FIG. 9B is connected to a conductor layer overlapping in the stacking direction T or another thorough hole overlapping in the stacking direction T when the first to eighteenth dielectric layers 51 to 68 are stacked. Among the plurality of through holes shown in FIG. 4A to FIG. 9B, ones located within a terminal or a conductor layer are connected to the terminal or the conductor layer.

Figure 11:
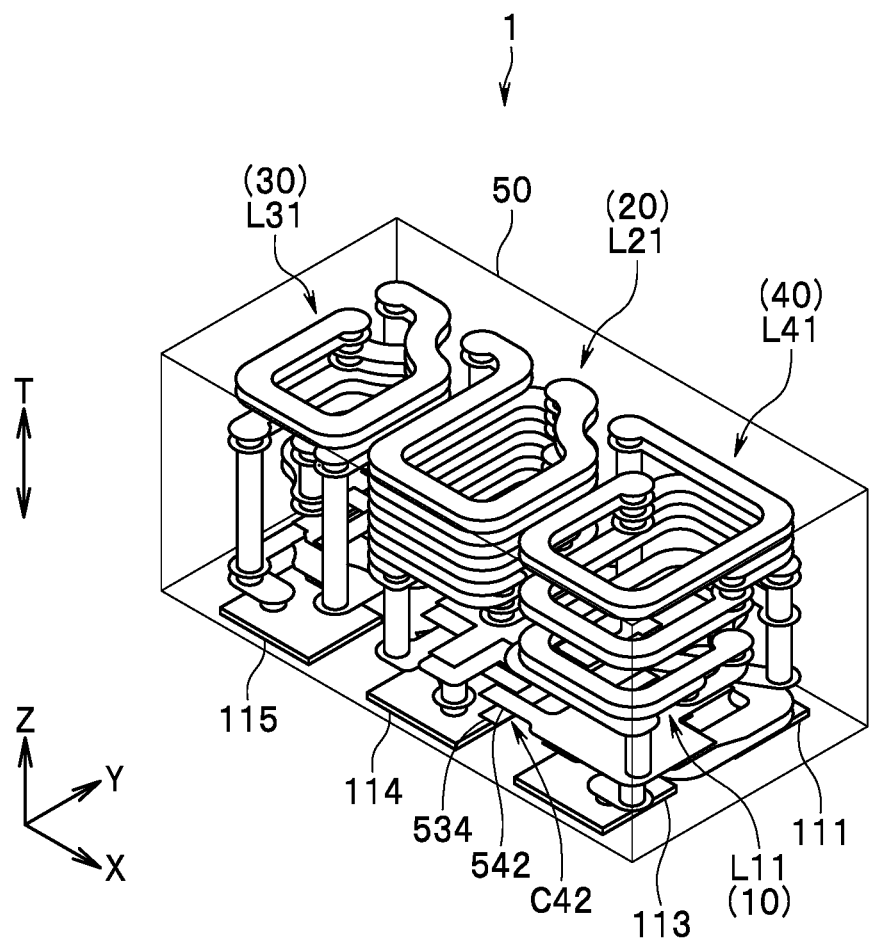
FIG. 11 is an internal perspective view showing the stack of the branching filter according to the first embodiment of the invention.

FIG. 11 shows the internal structure of the stack 50 formed by stacking the first to nineteenth dielectric layers 51 to 69. As shown in FIG. 11, the plurality of conductor layers and the plurality of through holes shown in FIG. 4A to 9C are stacked inside the stack 50. FIG. 11, the mark 691 is omitted.

Correspondences between the circuit components of the branching filter 1 shown in FIG. 1 and FIG. 2 and the internal components of the stack 50 shown in FIG. 4A to FIG. 8C will now be described. Initially, the components of the first filter 10 will be described. The inductor L11 is composed of the conductor layers 581, 591, and 601 shown in FIG. 6B to FIG. 7A and the through holes connected to those conductor layers.

The inductor L12 is composed of the conductor layers 521 and 531 shown in FIG. 4B and FIG. 4C, and the through holes connected to those conductor layers.

The capacitor C11 is composed of the conductor layers 541 and 551 shown in FIG. 5A and FIG. 5B, and the dielectric layer 54 interposed between those conductor layers.

The capacitor C12 is composed of the conductor layers 532 and 541 shown in FIG. 4C and FIG. 5A, and the dielectric layer 53 interposed between those conductor layers.

Next, the components of the second filter 20 will be described. The inductor L21 is composed of the conductor layers 592, 602, 612, 622, 632, 642, 652, 662, 672, and 682 shown in FIG. 6C to FIG. 9C and the through holes connected to those conductor layers.

The inductor L22 is composed of the terminal 116 and the conductor layers 523 and 545 shown in FIG. 4A to FIG. 5A, the through holes connecting the terminal 116 and the conductor layer 523, and the through holes connecting the conductor layers 523 and 545.

The capacitor C21 is composed of the conductor layers 552 and 592 shown in FIG. 5B and FIG. 6C, and the dielectric layers 55 to 58 each interposed between those conductor layers.

The capacitor C22 is composed of the conductor layers 522, 533, and 543 shown in FIG. 4B to FIG. 5A, and the dielectric layers 52 and 53 each interposed between two of those conductor layers.

The capacitor C23 is composed of the conductor layers 543 and 551 shown in FIG. 5A and FIG. 5B, and the dielectric layer 54 interposed between those conductor layers.

The capacitor C24 is composed of the conductor layers 602, 612, 622, 632, 642, 652, 662, and 672 shown in FIG. 7A to FIG. 9B, the dielectric layer 60 interposed between the conductor layers 602 and 612, the dielectric layer 62 interposed between the conductor layers 622 and 632, the dielectric layer 64 interposed between the conductor layers 642 and 652, and the dielectric layer 66 interposed between the conductor layers 662 and 672.

Next, the components of the third filter 30 will be described. The inductor L31 is composed of the conductor layers 653, 663, 673, and 683 shown in FIG. 8C to FIG. 9C and the through holes connected to those conductor layers.

The inductors L32 and L34 are each composed of the terminal 116 and the conductor layers 523 and 545 shown in FIG. 4A to FIG. 5A, the through holes connecting the terminal 116 and the conductor layer 523, and the through holes connecting the conductor layers 523 and 545. The inductors L22, L32, and L34 are composed of common components in the stack 50.

The inductor L33 is composed of the conductor layers 593, 603, 633, and 643 shown in FIG. 6C to FIG. 8B, and the through holes connected to those conductor layers.

The capacitor C31 is composed of the conductor layers 544 and 552 shown in FIG. 5A and FIG. 5B, and the dielectric layer 54 interposed between those conductor layers.

The capacitor C32 is composed of the conductor layers 535, 544, and 553 shown in FIG. 4C to FIG. 5B, and the dielectric layers 53 and 54 each interposed between two of those conductor layers.

The capacitor C33 is composed of the conductor layers 553 and 561 shown in FIG. 5B and FIG. 5C, and the dielectric layer 55 interposed between those conductor layers.

The capacitor C34 is composed of the conductor layers 663 and 673 shown in FIG. 9A and FIG. 9B, and the dielectric layer 66 interposed between those conductor layers.

The capacitor C35 is composed of the conductor layers 603 and 633 shown in FIG. 7A and FIG. 8B, and the dielectric layers 60 to 63 each interposed between those conductor layers.

The capacitor C36 is composed of the conductor layers 544 and 553 shown in FIG. 5A and FIG. 5B, and the dielectric layer 54 interposed between those conductor layers.

The capacitor C37 is composed of the conductor layers 523, 536, and 545 shown in FIG. 4B to FIG. 5A, and the dielectric layers 52 and 53 each interposed between two of those conductor layers.

Next, the components of the LC circuit 40 and the capacitor C42 will be described. The inductor L41 is composed of the conductor layers 631, 641, 651, 661, 671, and 681 shown in FIG. 8A to FIG. 9C and the through holes connected to those conductor layers.

The capacitor C41 is composed of the conductor layers 641, 651, 661, and 671 shown in FIG. 8B to FIG. 9B, the dielectric layer 64 interposed between the dielectric layers 641 and 651, and the dielectric layer 66 interposed between the dielectric layer 661 and 671.

The capacitor C42 is composed of the conductor layers 534 and 542 shown in FIG. 4C and FIG. 5A, and the dielectric layer 53 interposed between those conductor layers.

Now, the operation and effects of the branching filter 1 according to the present embodiment will be described. The branching filter 1 according to the present embodiment includes the first filter 10, the second filter 20, and the capacitor C42 connecting the first filter 10 and the second filter 20. The first end of the capacitor C42 is connected to the first path 11 between the inductor L11 (first inductor) of the first filter 10 and the first signal port 3. The second end of the capacitor C42 is connected to the third path 22 connecting the second path 21 and the inductor L21 (second inductor) of the second filter 20. According to the present embodiment, the pass attenuation of the second filter 20 in a high frequency band can thus be increased while preventing a deterioration in the insertion loss of the first filter 10.

The operation and effects of the capacitor C42 will be described below with reference to simulation results. Models used in the simulation will initially be described. In the simulation, a model of the branching filter 1 according to the present embodiment (hereinafter, referred to as a model of a practical example) and models of branching filters according to first to fourth comparative examples (hereinafter, referred to as models of the first to fourth comparative examples) without the capacitor C42 were used.

In the model of the practical example, the capacitor C42 had a capacitance of 0.036 pF, and the capacitor C11 had a capacitance of 1.608 pF. The capacitance between the first signal port 3 and the second signal port 4 was 0 pF.

The model of the first comparative example had the same configuration as that of the model of the practical example except for the absence of the capacitor C42.

The models of the second and third comparative examples had the same configuration as that of the model of the first comparative example except for the capacitance of the capacitor C11. In the model of the second comparative example, the capacitor C11 had a capacitance 0.25 pF higher than in the model of the first comparative example. In the model of the third comparative example, the capacitor C11 had a capacitance 0.75 pF higher than in the model of the first comparative example.

The model of the fourth comparative example had the same configuration as that of the model of the first comparative example except for the capacitance between the first signal port 3 and the second signal port 4. In the model of the fourth comparative example, the capacitance between the first signal port 3 and the second signal port 4 was 0.14 pF higher than in the model of the first comparative example.

In the simulation, the pass characteristics of the first to third filters 10, 20, and 30 were determined for each model of the practical example and the first to fourth comparative examples.

Figure 12:
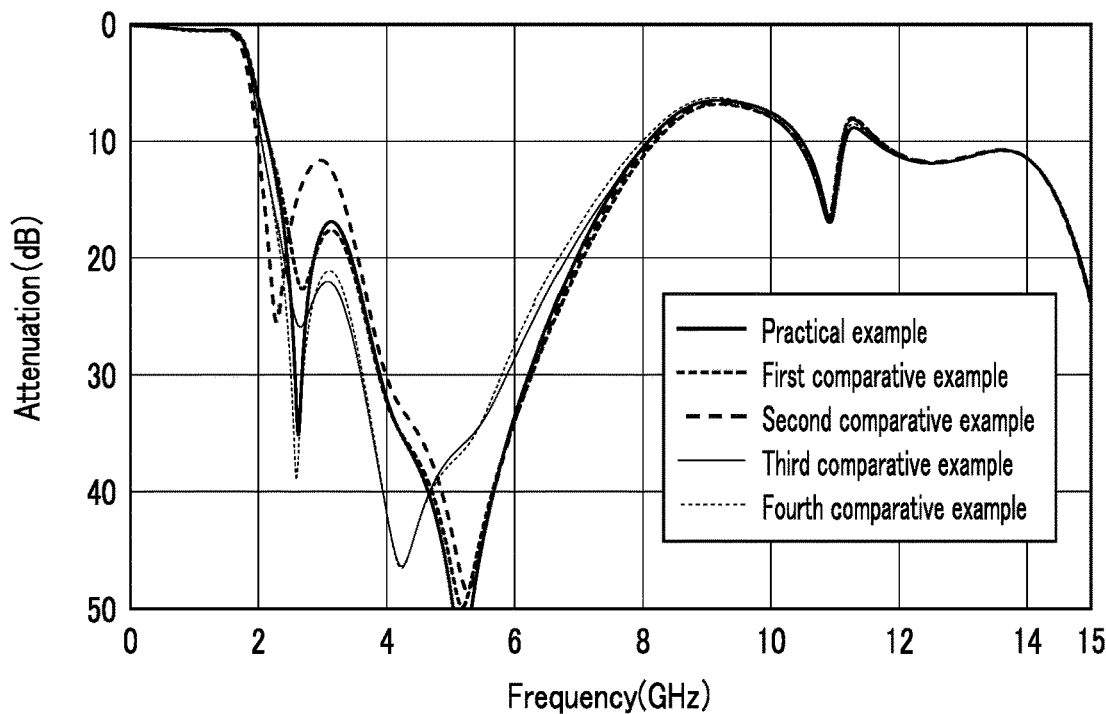
FIG. 12 is a characteristic chart showing a pass characteristic of a first filter in each model, determined by a simulation.
Figure 13:
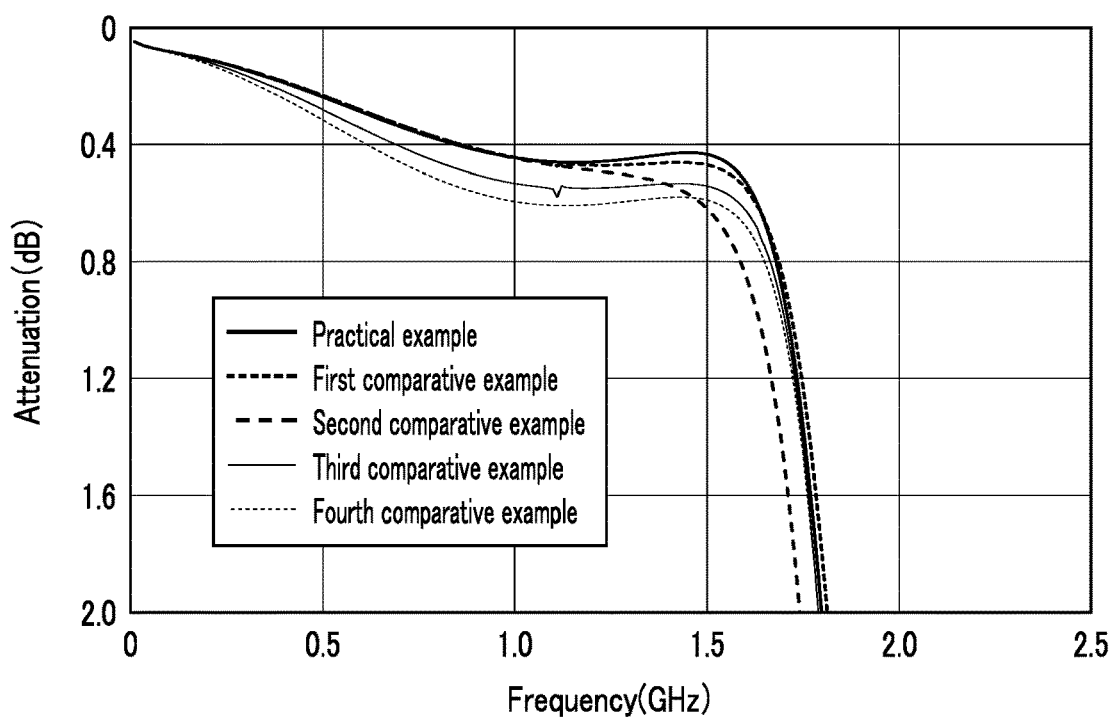
FIG. 13 is a characteristic chart showing a part of the pass characteristics shown in FIG. 12 in an enlarged scale.
Figure 14:
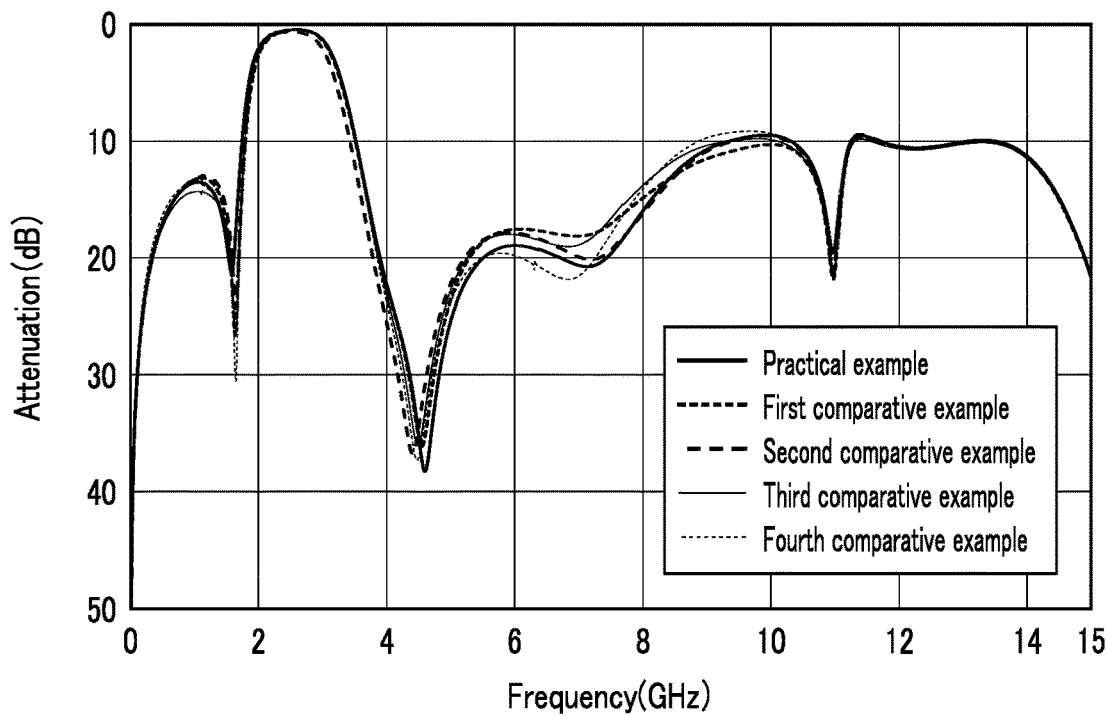
FIG. 14 is a characteristic chart showing a pass characteristic of a second filter in each model, determined by a simulation.
Figure 15:
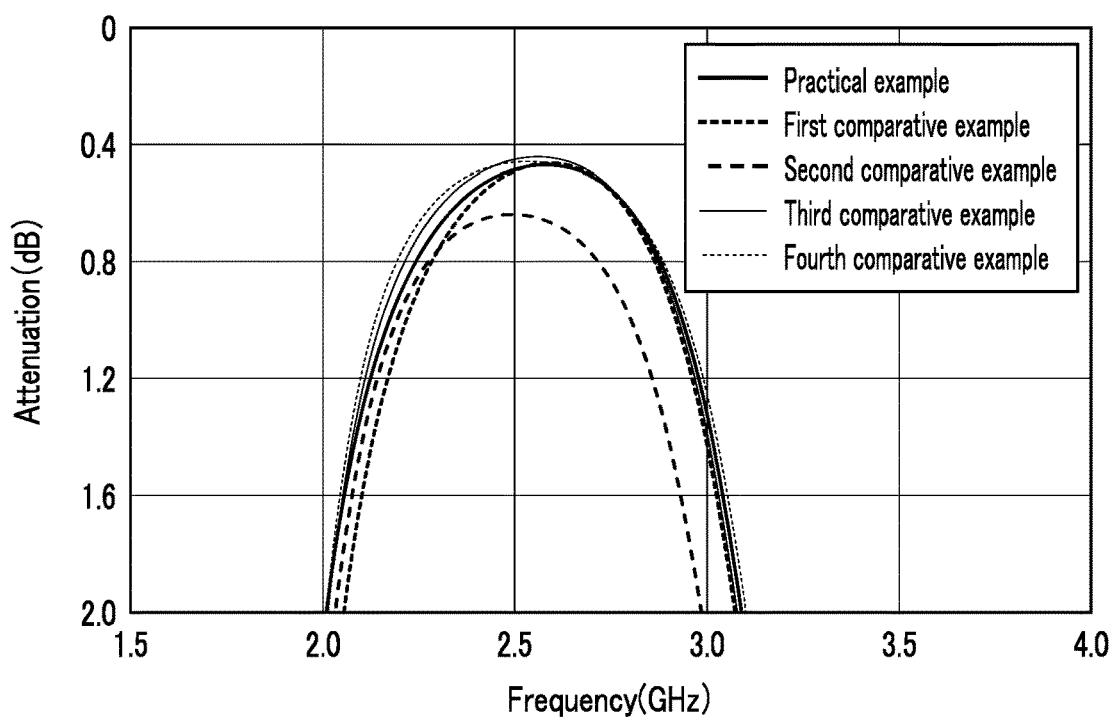
FIG. 15 is a characteristic chart showing a part of the pass characteristics shown in FIG. 14 in an enlarged scale.
Figure 16:
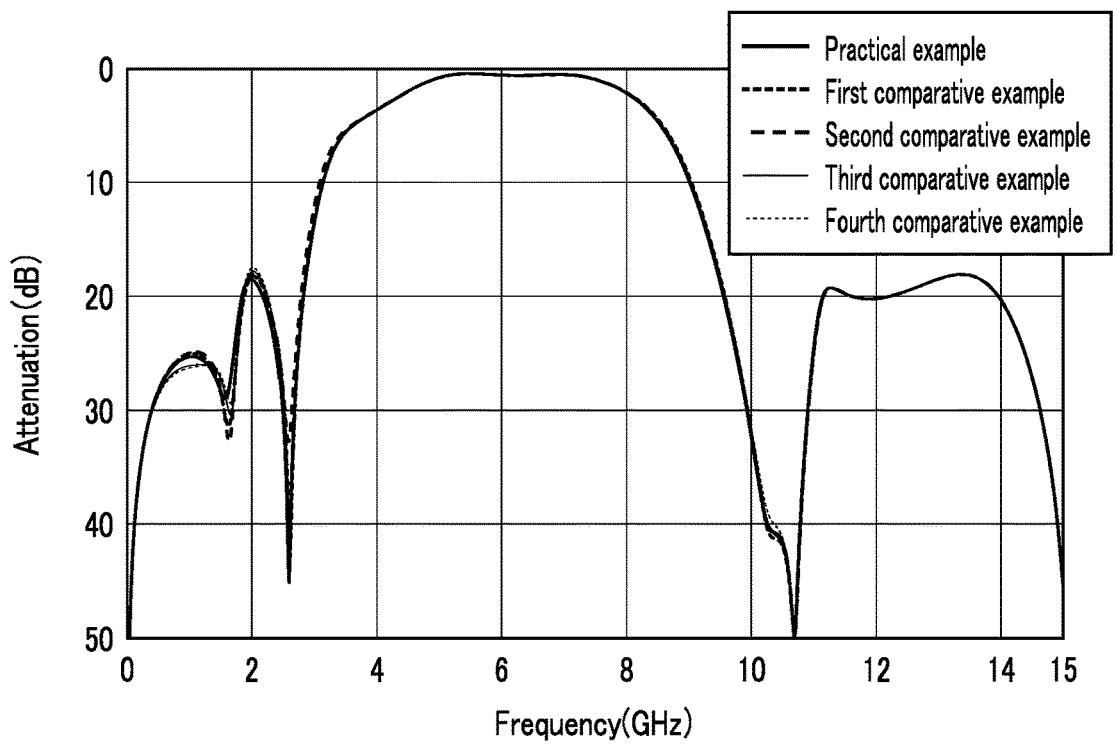
FIG. 16 is a characteristic chart showing a pass characteristic of a third filter in each model, determined by a simulation.
Figure 17:
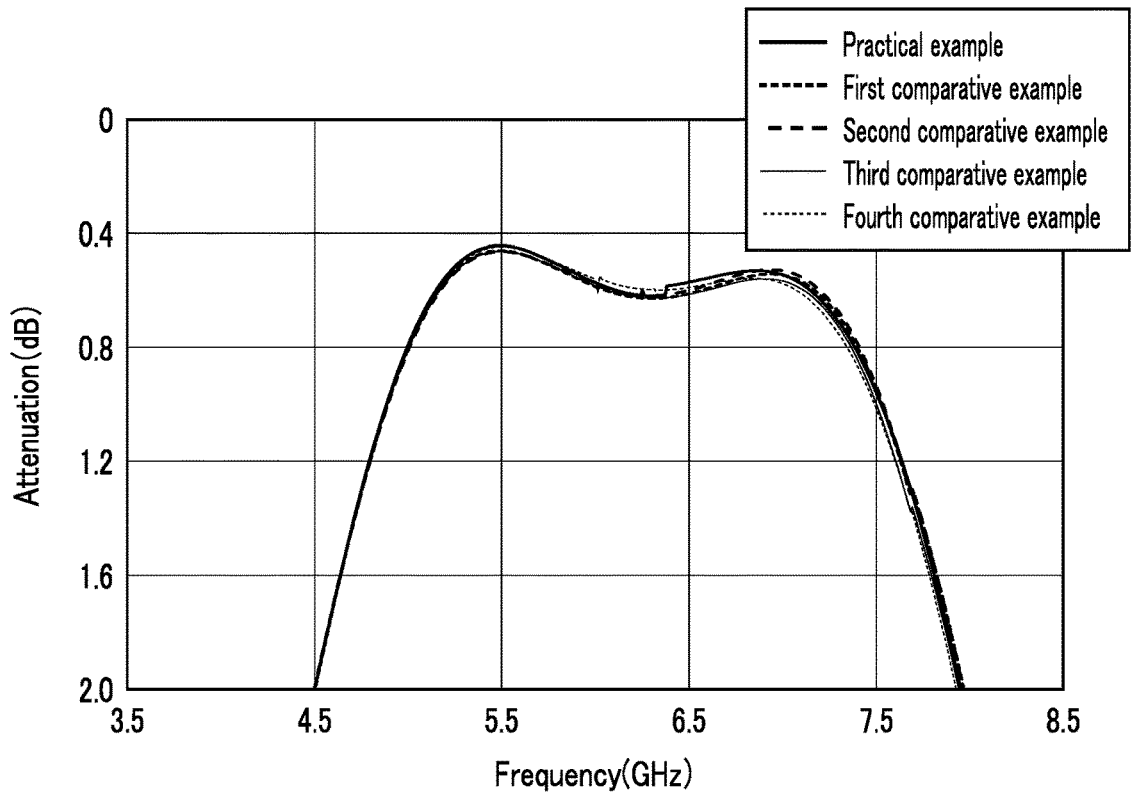
FIG. 17 is a characteristic chart showing a part of the pass characteristics shown in FIG. 16 in an enlarged scale.

Next, the results of the simulation will be described. FIG. 12 is a characteristic chart showing the pass characteristic of the first filter 10 in each model. FIG. 13 shows a part of FIG. 12 in an enlarged scale. FIG. 14 shows the pass characteristic of the second filter 20 in each model. FIG. 15 shows a part of FIG. 14 in an enlarged scale. FIG. 16 shows the pass characteristic of the third filter 30 in each model. FIG. 17 shows a part of FIG. 16 in an enlarged scale. In FIG. 12 to FIG. 17, the horizontal axis indicates frequency, and the vertical axis the attenuation. In the following description, the attenuation of the first filter 10 in the first passband will be referred to as the insertion loss of the first filter 10. The attenuation of the second filter 20 in the second passband will be referred to as the insertion loss of the second filter 20. The attenuation of the third filter 30 in the third passband will be referred to as the insertion loss of the third filter 30.

The model of the practical example and the model of the first comparative example will initially be compared. As shown in FIG. 14, in the model of the practical example, the pass attenuation of the second filter 20 in a frequency band near 7 GHz, which is higher than the second passband of the second filter 20, can be made greater than the pass attenuation in the model of the first comparative example. From this result, it can be seen that the provision of the capacitor C42 can form an attenuation pole on the high frequency side of the second passband in the pass characteristic of the second filter 20.

As shown in FIG. 13, the insertion loss of the first filter 10 in the model of the practical example is substantially the same as that of the first filter 10 in the model of the first comparative example. From this result, it can be seen that the provision of the capacitor C42 can increase the pass attenuation of the second filter 20 in the high frequency band while preventing a deterioration in the insertion loss of the first filter 10.

From FIG. 12, it can be seen that the attenuation pole of the pass characteristic of the first filter 10 in the model of the first comparative example varies greatly from that of the model of the practical example.

Next, the model of the practical example and the models of the second and third comparative examples will be compared. As described above, the models of the second and third comparative examples included the capacitor C11 of increased capacitance. The capacitor C11 can be regarded as a capacitor connecting the other end of the inductor L11 of the first filter 10 and the one end of the capacitor C21 of the second filter 20.

As shown in FIG. 14, for the model of the second comparative example, the pass attenuation of the second filter 20 in the frequency band near 7 GHz, which is higher than the second passband of the second filter 20, is able to be increased. However, as shown in FIG. 13 and FIG. 15, the insertion loss of the first filter 10 and the insertion loss of the second filter 20 in the model of the second comparative example are greater than those in the model of the practical example. As shown in FIG. 13 and FIG. 15, for the model of the third comparative example, the insertion loss of the second filter 20 is substantially the same as in the model of the practical example, whereas the insertion loss of the first filter 10 is greater than in the model of the practical example. As shown in FIG. 14, for the model of the third comparative example, the pass attenuation of the second filter 20 in the frequency band higher than the second passband of the second filter 20 is unable to be increased. From this result, it can be seen that the capacitor C11 is unable to provide the same effect as that of the capacitor C42.

From FIG. 12, it can be seen that in the model of the third comparative example, the attenuation pole of the pass characteristic of the first filter 10 varies greatly from the one in the model of the practical example.

Next, the model of the practical example and the model of the fourth comparative example will be compared. As described above, the model of the fourth comparative example is configured so that the capacitance between the first signal port 3 and the second signal port 4 is high. The model of the fourth comparative example can be said to substantially include a capacitor connecting the other end of the inductor L11 and the other end of the capacitor C22.

As shown in FIG. 14, in the model of the fourth comparative example, the pass attenuation of the second filter 20 in the frequency band near 7 GHz, which is higher than the second passband of the second filter 20, is able to be increased. However, as shown in FIG. 13, the insertion loss of the first filter 10 in the model of the fourth comparative example is greater than that in the model of the practical example. From this result, it can be seen that the capacitor connecting the other end of the inductor L11 and the other end of the capacitor C22 is unable to provide the same effect as that of the capacitor C42.

From FIG. 12, it can be seen that in the model of the fourth comparative example, the attenuation pole of the pass characteristic of the first filter 10 varies greatly from the one in the model of the practical example.

According to the present embodiment, the provision of the capacitor C42 can thus increase the pass attenuation of the second filter 20 in the high frequency band while preventing a deterioration in the insertion loss of the first filter 10.

As shown in FIG. 16 and FIG. 17, the pass characteristic and the insertion loss of the third filter 30 vary little between the models.

As another method for forming an attenuation pole, the number of filter stages can be increased. This, however, makes the filters and the branching filter including the filters large in size. By contrast, according to the present embodiment, the provision of the capacitor C42 can form the attenuation pole without increasing the number of stages of the second filter 20.

Second Embodiment

Figure 18:
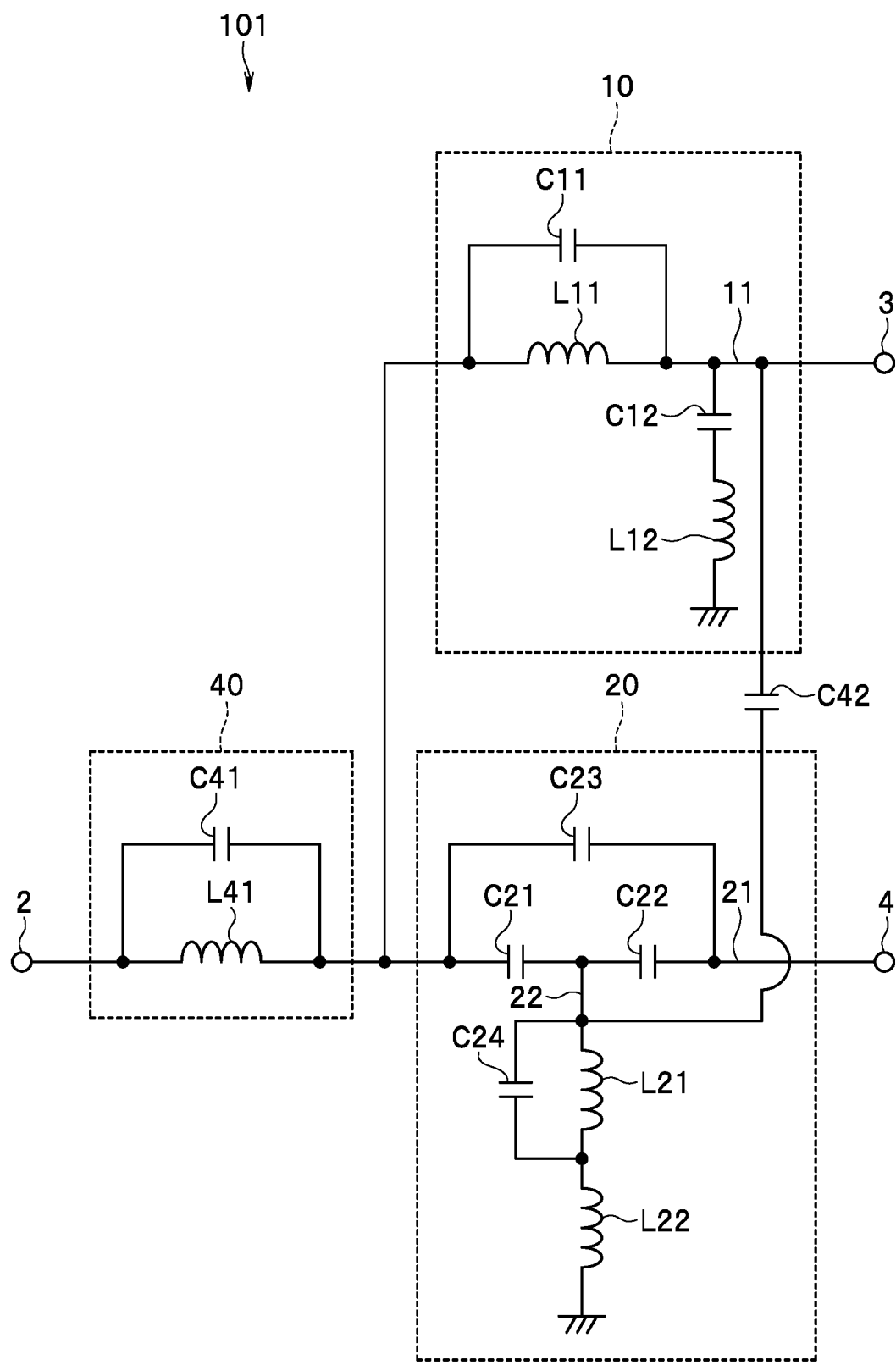
FIG. 18 is a circuit diagram showing circuit configuration of a branching filter according to a second embodiment of the invention.

A second embodiment of the invention will now be described. A brief description of the circuit configuration of a branching filter according to the present embodiment will initially be given with reference to FIG. 18. FIG. 18 shows the circuit configuration of the branching filter according to the present embodiment. A branching filter 101 according to the present embodiment has the same configuration as that of the branching filter 1 according to the first embodiment except for the absence of the third filter 30 and the third signal port 5. The branching filter 101 is a diplexer including the first filter 10 and the second filter 20.

Figure 19:
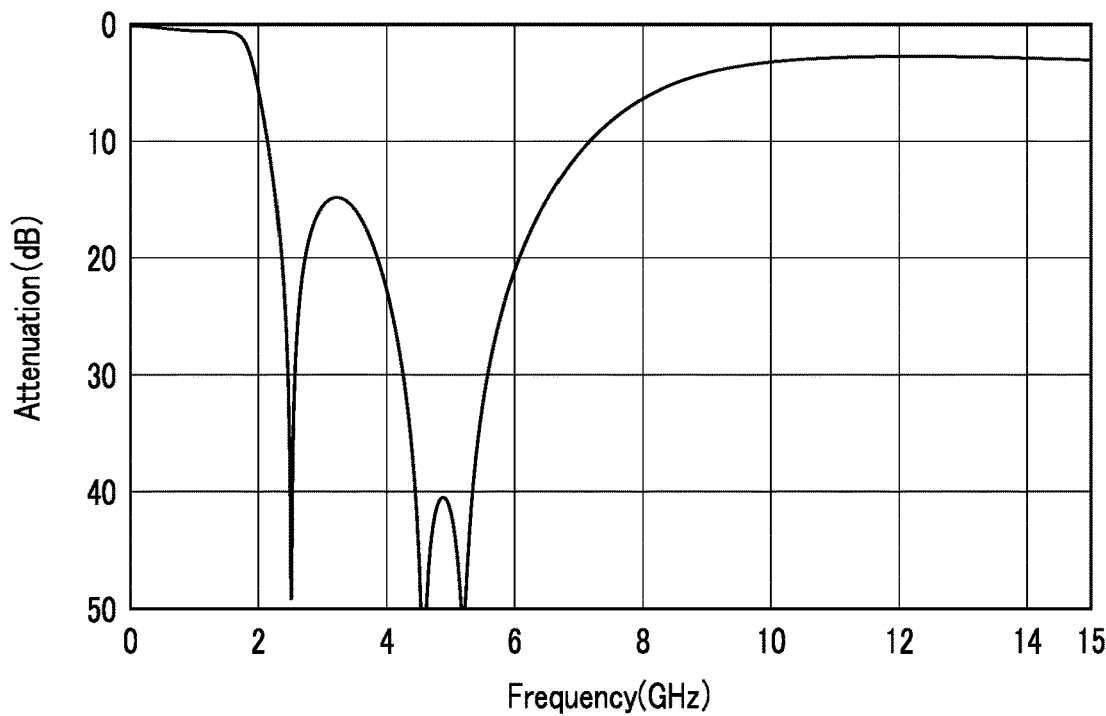
FIG. 19 is a characteristic chart showing an example of the pass characteristic of a first filter in the branching filter according to the second embodiment of the invention.
Figure 20:
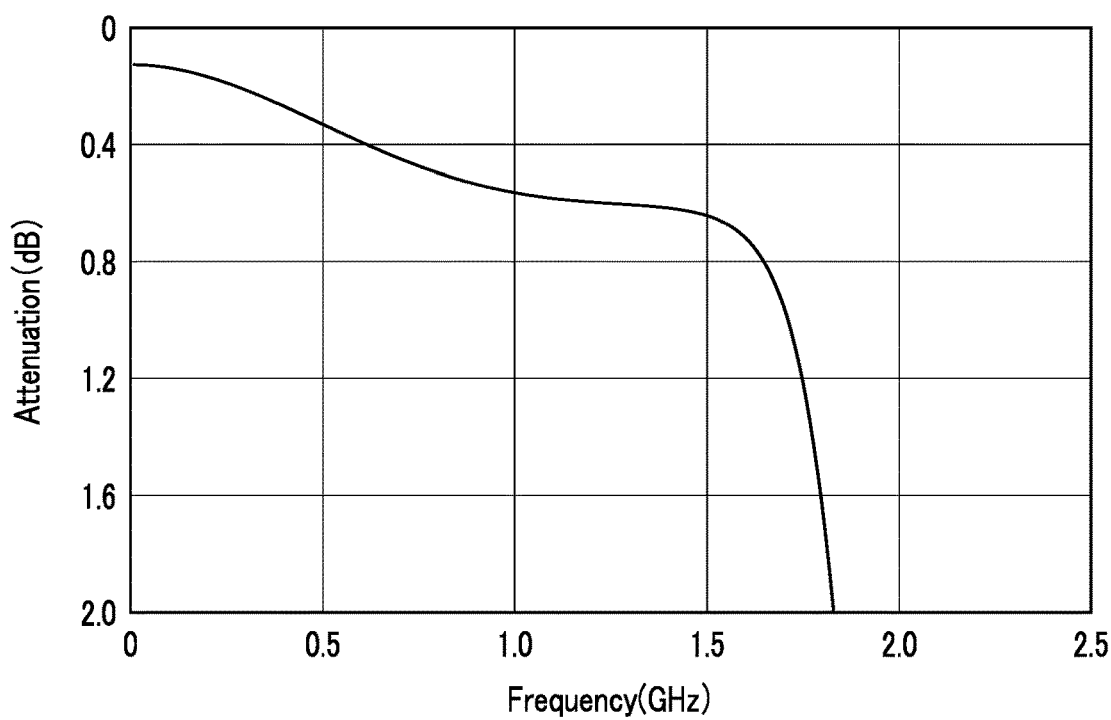
FIG. 20 is a characteristic chart showing a part of the pass characteristics shown in FIG. 19 in an enlarged scale.
Figure 21:
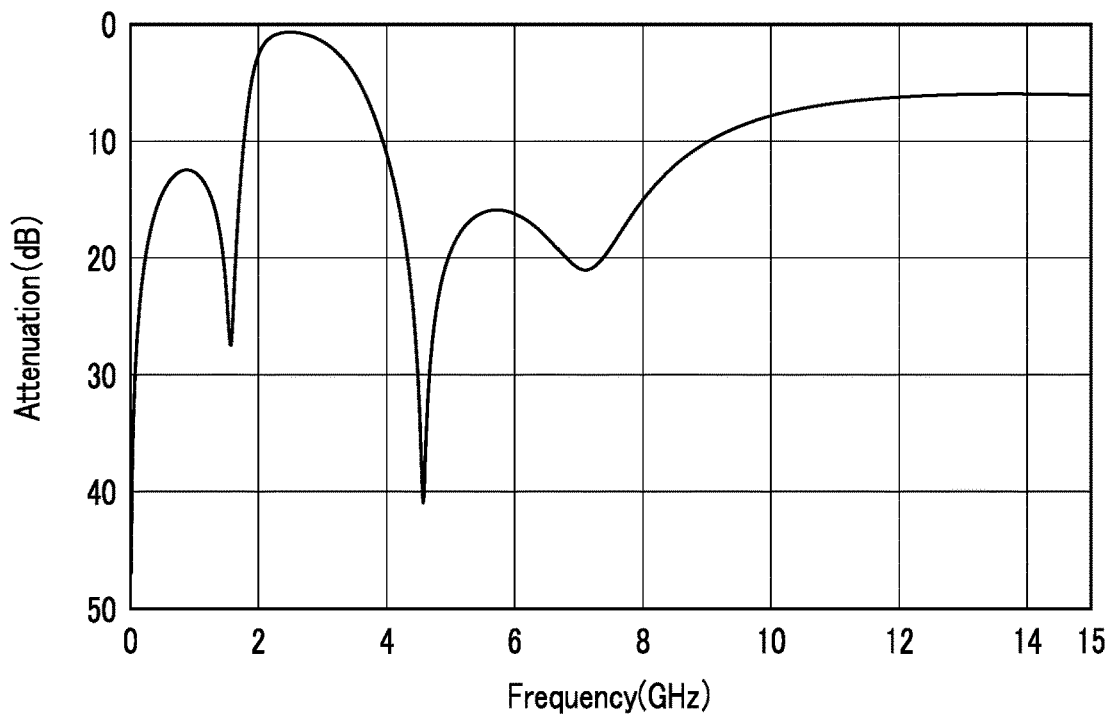
FIG. 21 is a characteristic chart showing an example of the pass characteristic of a second filter in the branching filter according to the second embodiment of the invention.
Figure 22:
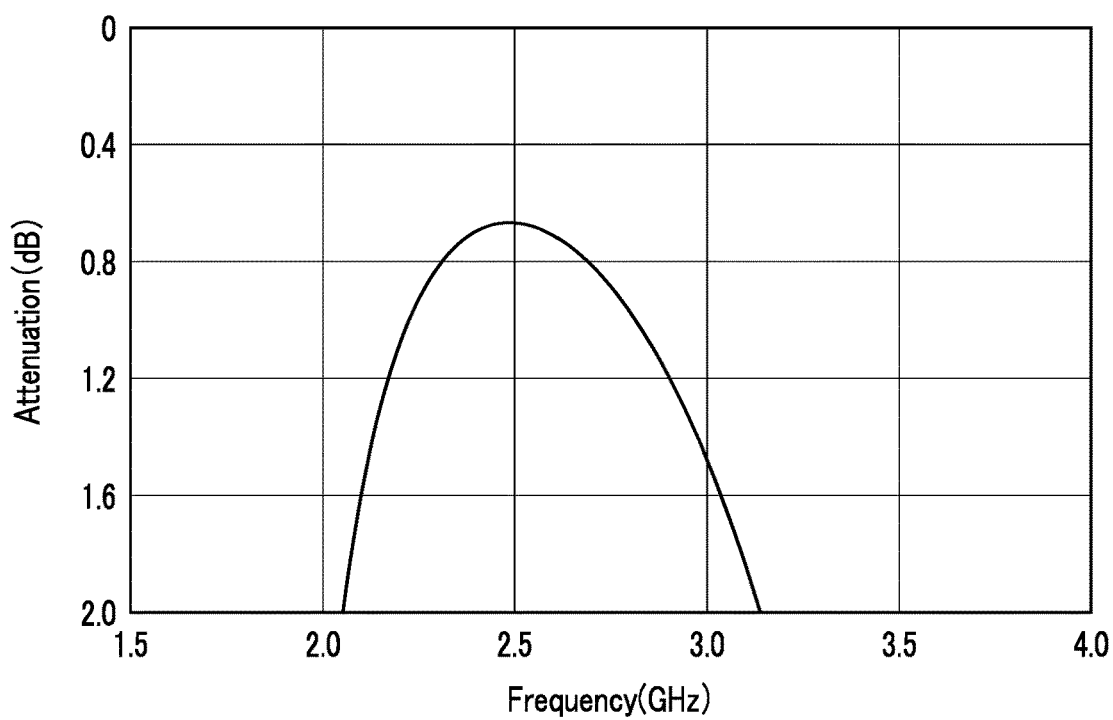
FIG. 22 is a characteristic chart showing a part of the pass characteristics shown in FIG. 21 in an enlarged scale.

Next, examples of the characteristics of the branching filter 101 will be described with reference to FIG. 19 to FIG. 22. FIG. 19 is a characteristic chart showing an example of the pass characteristic of the first filter 10 of the branching filter 101. FIG. 20 shows a part of FIG. 19 in an enlarged scale. FIG. 21 shows an example of the pass characteristic of the second filter 20 of the branching filter 101. FIG. 22 shows a part of FIG. 21 in an enlarged scale. In FIG. 19 to FIG. 22, the horizontal axis indicates frequency, and the vertical axis the attenuation.

As shown in FIG. 21, the branching filter 101 forms an attenuation pole in a frequency band near 7 GHz in the pass characteristic of the second filter 20. As described in the first embodiment, this attenuation pole is formed by the capacitor C42. The branching filter 101 can thus increase the pass attenuation of the second filter 20 in the frequency band near 7 GHz, which is higher than the second passband of the second filter 20.

The configuration, operation and effects of the present embodiment are otherwise the same as those of the first embodiment.

The present invention is not limited to the foregoing embodiments, and various modifications may be made thereto. For example, the configurations of the first to third filters 10, 20, and 30 in the present invention are not limited to the examples described in the respective embodiments and may be optional as long as the requirements set forth in the claims are met.

In the branching filter according to the present invention, a second capacitor connecting the first filter 10 and the third filter 30 may be provided instead of or in addition to the capacitor C42 connecting the first filter 10 and the second filter 20. Like the capacitor C42, a first end of the second capacitor is connected to the first path 11 between the inductor L11 (first inductor) of the first filter 10 and the first signal port 3. A second end of the second capacitor may be connected to one end of an inductor of the third filter 30, where the third filter 30 is provided between the path connecting the common port 2 to the third signal port 5 and the ground.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A branching filter comprising:
   a common port;
   a first signal port;
   a second signal port;
   a first filter provided between the common port and the first signal port, and configured to selectively pass a signal of a frequency within a first passband;
   a second filter provided between the common port and the second signal port, and configured to selectively pass a signal of a frequency within a second passband different from the first passband;
   a first path that connects the common port and the first signal port;
   a second path that connects the common port and the second signal port; and
   a capacitor having a first end and a second end, and connecting the first filter and the second filter, the capacitor being not provided in either the first path or the second path.

2. The branching filter according to claim 1, wherein the second passband is a frequency band higher than the first passband.

3. The branching filter according to claim 2, wherein:
the first filter includes a first inductor provided in the first path; and
the first end of the capacitor is connected to the first path between the first inductor and the first signal port.

4. The branching filter according to claim 2, wherein:
the second filter includes a second inductor provided between the second path and a ground; and
the second end of the capacitor is connected to a third path that connects the second path and the second inductor.

5. The branching filter according to claim 2, wherein the capacitor forms an attenuation pole on a high frequency side of the second passband in a pass characteristic of the second filter.

6. The branching filter according to claim 1, wherein the first filter and the second filter constitute a diplexer.

7. The branching filter according to claim 1, further comprising:
a third signal port; and
a third filter provided between the common port and the third signal port, and configured to selectively pass a signal of a frequency within a third passband different from the first and second passbands.

8. The branching filter according to claim 7, wherein the third passband is a frequency band higher than the first and second passbands.

9. The branching filter according to claim 7, wherein the first filter, the second filter, and the third filter constitute a triplexer.

* * * * *